(12) United States Patent
Makino

(10) Patent No.: US 8,121,170 B2
(45) Date of Patent: Feb. 21, 2012

(54) GAIN-COUPLED DISTRIBUTED FEEDBACK SEMICONDUCTOR LASER INCLUDING FIRST-ORDER AND SECOND-ORDER GRATINGS

(75) Inventor: Toshihiko Makino, Irvine, CA (US)

(73) Assignee: Applied Optoelectronics, Inc., Sugar Land, TX (US)

( * ) Notice: Subject to any disclaimer, the term of this patent is extended or adjusted under 35 U.S.C. 154(b) by 222 days.

(21) Appl. No.: 12/119,586

(22) Filed: May 13, 2008

(65) Prior Publication Data
US 2009/0080482 A1   Mar. 26, 2009

Related U.S. Application Data

(63) Continuation-in-part of application No. 11/280,517, filed on Aug. 24, 2005, now Pat. No. 7,583,719.

(51) Int. Cl.
*H01S 5/00* (2006.01)
*H01S 3/08* (2006.01)

(52) U.S. Cl. .......... 372/96; 372/50.11; 372/102

(58) Field of Classification Search .......... 372/50.11, 372/96, 102
See application file for complete search history.

(56) References Cited

U.S. PATENT DOCUMENTS

| | | | |
|---|---|---|---|
| 5,164,956 A | 11/1992 | Lang | |
| 5,208,824 A | 5/1993 | Tsang | |
| 5,337,183 A * | 8/1994 | Rosenblatt | 359/248 |
| 5,452,318 A | 9/1995 | Makino et al. | |
| 6,104,739 A | 8/2000 | Hong et al. | |
| 6,330,265 B1 | 12/2001 | Kinoshita | |
| 6,608,855 B1 | 8/2003 | Hwang et al. | |
| 7,180,930 B2 | 2/2007 | Takaki et al. | |
| 2001/0030985 A1* | 10/2001 | Abeles | 372/43 |
| 2006/0056479 A1* | 3/2006 | Evans et al. | 372/64 |
| 2007/0053404 A1 | 3/2007 | Makino | |

OTHER PUBLICATIONS

Henry, "Observation of Destructive Interference in the Radiation Loss of Second-Order Distributed Feedback Lasers," IEEE Journal of Quantum Electronics, vol. QE-21, No. 2, Feb. 1985, pp. 151-154.
Kazarinov, et al., "Second-Order Distributed Feedback Lasers with Mode Selection Provided by First-Order Radiation Losses," IEEE Journal of Quantum Electronics, vol. QE-21, No. 2, Feb. 1985, pp. 144-150.

(Continued)

*Primary Examiner* — Armando Rodriguez
(74) *Attorney, Agent, or Firm* — Grossman Tucker Perreault & Pfleger, PLLC; Norman S. Kinsella

(57) ABSTRACT

A gain-coupled distributed feedback (DFB) semiconductor laser includes a grating formed by grooves through at least a part of an active region of a laser cavity. The DFB laser may be configured with a substantially pure gain-coupled grating and may be configured to provide facet power asymmetry. The grating may include at least a first-order grating section and a second-order grating section. A lasing wavelength may be obtained at the Bragg wavelength of the second-order grating section by substantially eliminating index coupling in the grating. The first-order grating section may act as a reflector for the lasing wavelength, thereby producing asymmetric power distribution in the laser cavity.

14 Claims, 3 Drawing Sheets

OTHER PUBLICATIONS

Hong, et al., "Matrix-Grating Strongly Gain-Coupled (MG-SGC) DFB Lasers with 34-nm Continuous Wavelength Tuning Range," IEEE Photonics Technology Letters, vol. 11, No. 5, May 1999, pp. 515-517.

Hong, et al., "Strongly Gain-Coupled (SGC) Coolerless (-40°C ~ +85°C) MQW DFB Lasers," IEEE Journal of Selected Topics in Quantum Electronics, vol. 5, No. 3, May/Jun. 1999, pp. 442-448.

Woods, "Transmission over 560 km at 2.5 Gb/s using a directly modulated buried heterostructure gain-coupled DFB semiconductor laser," Thursday Morning, OFC 2002, pp. 422-423.

Booknam Data Sheet, "2.5 Gb/s Buried Het Laser 360km Extended Reach With Optional Etalon Stabilization LC25W-B (360km)," available at http://www.bookham.com/documents/datasheets_tn/LC25W-B_14Feb07.pdf.

Kogelnik, et al., "Coupled-mode theory of distributed feedback lasers," Journal of Applied Physics, vol. 43, No. 5, pp. 2327-2335, May 1972.

Utaka, et al., "$\lambda$/4-shifted inGaAsP/InPDFB lasers," IEEE Journal of Quantum Electronics, vol. QE-22, No. 7, pp. 1042-1052, Jul. 1986.

Kapon, et al. "The effect of complex coupling coefficients on distributed feedback lasers," IEEE Journal of Quantum Electronics, vol. QE-19, pp. 66-71, Jan 1982.

Lou, et al., "Purely gain-coupled distributed feedback semiconductor lasers," Appl. Phys. Lett., vol. 56, No. 17, pp. 1620-1622, Apr. 1990.

U.S. Office Action dated Dec. 24, 2008 issued in related U.S. Appl. No. 11/280,517.

* cited by examiner

GAIN-COUPLED DISTRIBUTED FEEDBACK SEMICONDUCTOR LASER INCLUDING FIRST-ORDER AND SECOND-ORDER GRATINGS

CROSS-REFERENCE TO RELATED APPLICATIONS

This application is a continuation-in-part of U.S. patent application Ser. No. 11/280,517, filed on Aug. 24, 2005 and is related to U.S. patent application Ser. No. 7,583,719 filed concurrently herewith, both of which are fully incorporated herein by reference.

TECHNICAL FIELD

The present invention relates to distributed feedback (DFB) lasers and in particular, to gain-coupled DFB semiconductor lasers including first-order and second-order gratings.

BACKGROUND INFORMATION

Semiconductor lasers may be used in a variety of industrial and scientific applications, such as optical communications. Optical communications applications, for example, may employ lasers that emit light at a particular lasing wavelength (e.g., 1.31 µm or 1.55 µm) suitable for transmission through optical fibers. Semiconductor lasers may be desirable over other types of lasers because they have a relatively small volume and consume a relatively small amount of power.

Lasers generally include a laser cavity defined by mirrors or reflectors and an optical gain medium between the reflectors in the laser cavity. When pumped with pumping energy (e.g., an electrical current), the gain medium amplifies electromagnetic waves (e.g., light) in the cavity by stimulated emission, thereby providing optical gain and generating a laser light output. In semiconductor lasers, a semiconductor active layer or region serves as the gain medium and reflectors provide optical feedback for laser oscillation within the active region. In Fabry-Perot lasers, for example, a set of mirrors or cleaved facets bound the active region to provide the optical feedback. In other semiconductor lasers, such as distributed feedback (DFB) lasers and distributed Bragg reflector (DBR) lasers, one or more diffraction gratings (e.g., Bragg gratings) may be used to provide reflectance. In a DFB laser, for example, a distributed reflector (e.g., a diffraction grating or Bragg grating) along the active region provides the optical feedback and may be used to restrict oscillation to a single mode.

Fiber optic communication systems may require a high performance light source capable of generating single-mode, narrow spectral linewidth emission in the 1.3-1.56 µm wavelength range. Some of the existing semiconductor lasers (e.g., InGaAsP DFB lasers) fail to provide stable single-mode operation that is insensitive to ambient temperature change (uncooled operation) and insensitive to external optical feedback (isolator-less operation) and/or fail to provide high single-mode yield and high output power. Complex-coupled DFB lasers have been developed that provide advantages such as high single-mode yield, less sensitivity to external optical feedback, high modulation bandwidth and reduced wavelength chirp. Multiple quantum well (MQW) DFB lasers with etched quantum wells, for example, may provide high single-mode stability.

Complex-coupled DFB lasers generally provide both index coupling and gain coupling. Certain complex-coupled DFB lasers will predominantly lase on the longer wavelength side of the Bragg stop band (i.e., the long Bragg mode). In complex-coupled DFB lasers with periodically etched MQWs, however, there are still fundamental problems such as variations of the complex coupling coefficient due to variations of grating etching depth, laser performance variations due to random variations of facet grating phase, and variations in lasing wavelength due to the ratio of index to gain coupling.

BRIEF DESCRIPTION OF THE DRAWINGS

These and other features and advantages will be better understood by reading the following detailed description, taken together with the drawings wherein.

DETAILED DESCRIPTION

In general, a gain-coupled distributed feedback (DFB) semiconductor laser includes a grating formed by grooves formed in at least a part of an active region of a laser cavity. The DFB laser may be configured with a substantially pure gain-coupled grating and may be configured to provide facet power asymmetry. As will be described in greater detail below, the grating may include at least a first-order grating section and a second-order grating section. A lasing wavelength may be obtained at the Bragg wavelength of the second-order grating section by substantially eliminating index coupling in the grating. The first-order grating section may act as a reflector for the lasing wavelength, thereby producing asymmetric power distribution in the laser cavity.

As used herein, "substantially eliminating index coupling" and "substantially pure gain-coupling" refer to the reduction of index coupling in a grating at least to a point where the effects of index coupling are negligible and gain coupling predominates. The terms "substantially eliminating index coupling" and "substantially pure gain-coupling" include, but do not require, the complete elimination of index coupling.

Figure 1:
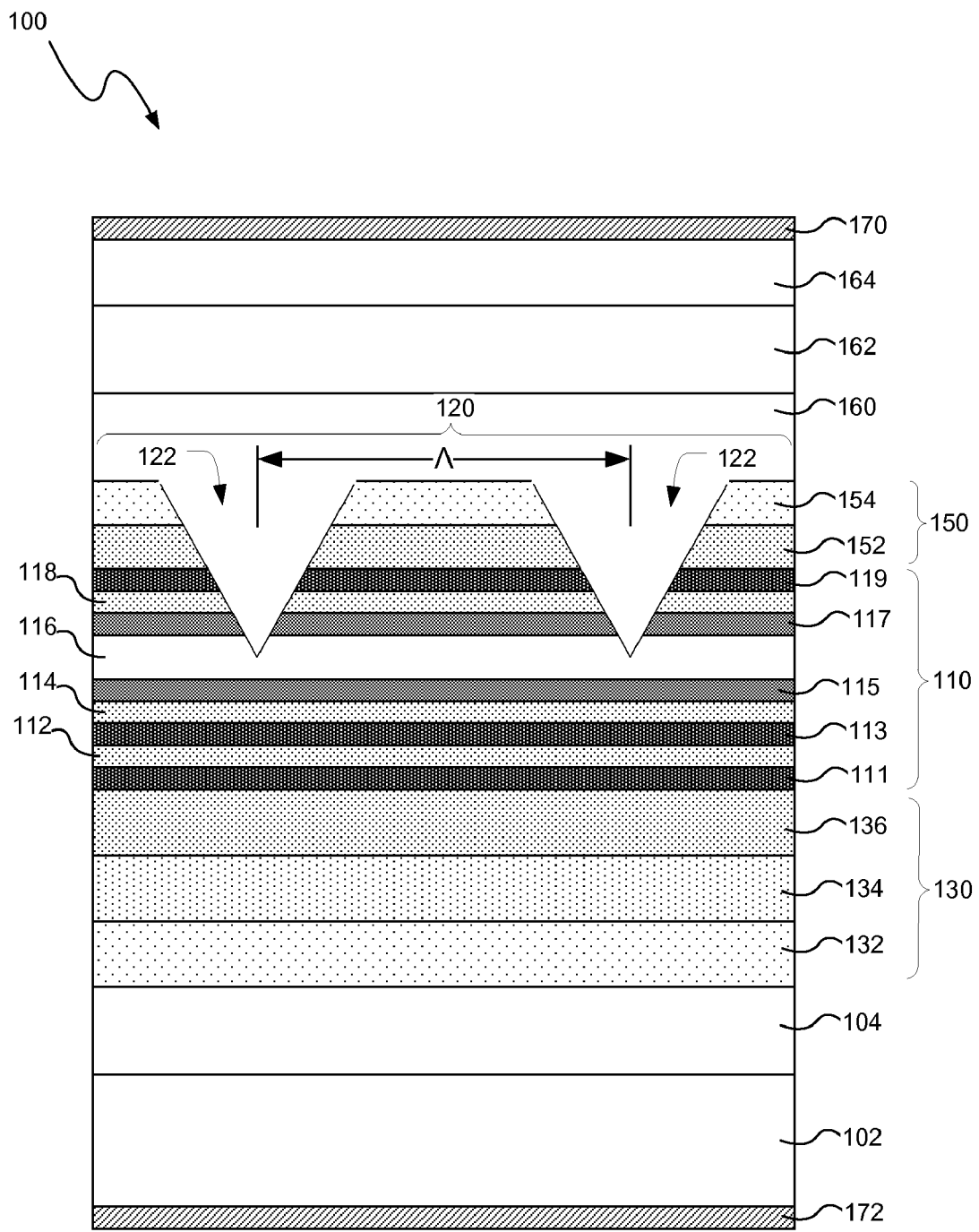
FIG. 1 is a cross-sectional view of a portion of a gain-coupled DFB laser, consistent with an embodiment.

Referring to FIG. 1, a gain-coupled DFB laser device 100, consistent with an embodiment, is described in greater detail. The DFB laser device 100 includes an active region 110 with periodic variation of thickness to form a grating 120. The active region 110 may include quantum-well (QW) layers 111, 113, 115, 117, 119 and barrier layers 112, 114, 116, 118. The grating 120 is formed by grooves 122 extending at least partially through the active region 110, for example, through some of the QW layers 117, 119 and into one of the barrier layers 116. The grooves 122 may be spaced along at least a portion of the active region 110 (only a section of the DFB laser device 100 is shown in FIG. 1).

The laser device 100 may also include a semiconductor substrate 102 (e.g., an N-type In P substrate) on which is grown a buffer layer 104 (e.g., 1.5 µm thick layer of N-type In P). A first confinement region 130 may be provided over the buffer layer 104. The first confinement region may include three confinement layers 132, 134, and 136, for example, of N-type InGaAsP with band gap energies corresponding to wavelengths of 1.0 µm, 1.05 µm, and 1.1 µm, respectively. The thickness of each of the confinement layers 132, 134, 136 may be about 20 nm.

The active region 110 overlies the confinement region 130 and may include five QW layers 111, 113, 115, 117, 119 and four barrier layers 112, 114, 116, 118. The barrier layers 112, 114, 118 may be made of InGaAsP composition with a band gap energy corresponding to a wavelength of 1.1 µm and may each be about 10 nm thick. The QW layers 111, 113, 119 may be made of InGaAsP composition and may be tailored so as to provide a first transition energy of the QW, corresponding to a wavelength of 1.31 µm. The barrier layer 116 may be made of In P with the layer being 10~20 nm thick. The QW layers 115 and 117 may be made of InGaAsP composition and may be tailored so as to provide a first transition energy of the QW, corresponding to a wavelength of 1.31 µm. The QW transition energy may be determined by a combination of the QW alloy composition (e.g., having a PL peak wavelength of around 1.3 µm), strain (e.g., compressive strain of 1%), thickness (e.g., 6~7 nm), and the band gap energy of their adjacent barrier layers (e.g., a band gap energy corresponding to a wavelength of 1.1 µm).

A second confinement region 150 may be provided on top of the active region 110. The second confinement region 150 may include two confinement layers 152, 154 of InGaAsP with band gap energies corresponding to wavelengths of 1.1 µm, and 1.0 µm, respectively, and each with a layer thickness of about 20 nm.

The grating 120 may be defined by periodically etching the grooves 122, for example, through the QW layers 117, 119 and stopping in the barrier layer 116. The grating 120 may be a Bragg grating in which a grating period or pitch $\Lambda$ of the grating is related to the Bragg wavelength $\lambda_B$ as follows:

$$\lambda_{B,q} = 2 n_e \Lambda / q$$

where $n_e$ is the effective index of refraction and q is an integer (q=1, 2, . . . ). The pitch $\Lambda$ of the grooves of the grating 120 may be selected so as to define an order of the grating, as will be described in greater detail below. A fill layer 160 having substantially the same band gap energy as the barrier layer 116 may fill the grooves 122 of the grating 120. The fill layer 160 may be a P-type InP material grown to fill the grooves and to make a layer of 0.2 µm thickness on top of the confinement layer 154.

An upper cladding layer 162 may be provided on the fill layer 160 followed by a highly doped P-type capping layer 164 for contact enhancement. The upper cladding layer 162 may be a layer of P-type In P having a thickness of 1.3~1.6 µm and the capping layer 164 may be a layer of InGaAs having a thickness 200 nm. The laser device 100 may also include top electrode 170 and bottom electrode 172 for current injection into the laser device 100.

In operation, the wavelength corresponding to a transition between the first quantized levels of conduction and valance bands of a QW with symmetric barriers is given by the following equation:

$$\lambda(\mu m) = \frac{1.24}{E_g + E_c + E_v} \quad (1)$$

where $E_g$ is the band gap energy of the QW (in unit eV), and $E_c$ and $E_v$ are the quantized energy levels in the conduction and valence bands, respectively (in unit eV). $E_c$ can be approximated as $$E_c = \left[\frac{\pi}{2} \frac{a_c}{W + \Delta W_c}\right]^2 \quad (2)$$

where $$\Delta W_c = \frac{a_c}{\sqrt{b_c \Delta E_c}} \quad (3)$$

$$a_c = \frac{2\hbar}{\sqrt{2 m_{cw}}} \quad (4)$$

$$b_c = \frac{m_{cw}}{m_{cb}} \quad (5)$$

$\Delta E_c$ is the discontinuity of the band edge of the conduction band, his Planck's constant divided by $2\pi$, W is the QW width, and $m_{cw}$ and $m_{cb}$ are the effective masses of electrons inside the well, and the barrier, respectively. The quantized energy $E_v$ for the valance band can be expressed by equation (2) replacing subscript "c" with a subscript "v". It can be seen from equation (2) that the larger $\Delta E_c$ ($\Delta E_v$) gives larger $E_c$ ($E_v$), which in turn gives shorter first transition wavelength $\lambda$ in equation (1). Thus, the barrier having larger band gap energy has a shorter first transition wavelength for a given QW.

According to the exemplary embodiment, the QW layers 111, 113, 119 may include, for example, a lattice matched quaternary (Q) InGaAsP QW layer of band gap energy of 0.886 eV and thickness 65 nm and with a corresponding wavelength of 1.4 µm (also referred to as a 1.4 Q). The QW layers 111, 113, 119 may have symmetric 1.1 Q barrier layers 112, 114, 118, and, in this example, the first transition wavelength of this symmetric QW structure is calculated to be 1.313 µm. The other two QW layers 115, 117 may have asymmetric barrier layers, for example, 1.1 Q barrier layers 114, 118 and barrier layer 116 of In P with a band gap energy of 1.35 eV. The first transition wavelength of this asymmetric QW structure is calculated numerically to be 1.300 µm. For comparison, the first transition wavelength of a symmetric QW structure with symmetric In P is calculated by the equations above to be 1.279 µm. Therefore, the first transition wavelength (1.300 µm) of the asymmetric QW structure with 1.1 Q and In P barriers is between those of the symmetric QW structures with 1.1 Q and In P barriers (i.e., between the wavelengths 1.313 µm and 1.279 µm, respectively). Thus, the first transition wavelength of a QW may be made shorter by using a barrier layer of larger band gap energy. The symmetric and asymmetric quantum-well structures may provide the same gain peak wavelength in order to have a sufficient modal gain for lasing. The first transition wavelength of the two asymmetric QW structures can be increased from 1.300 µm to 1.313 µm by increasing the QW thickness slightly. In this way, the two types of quantum-well structures may be tailored to provide almost same gain peak wavelengths.

A gain-coupled DFB laser device, consistent with embodiments described herein, may also have other configurations and layers and may have other grating structures. In particular, other numbers and types of QW layers and barrier layers may be used. Also, although a triangular or trapezoidal shape is shown for the grating, other shapes may also be used such as square or sinusoidal.

Figure 2:
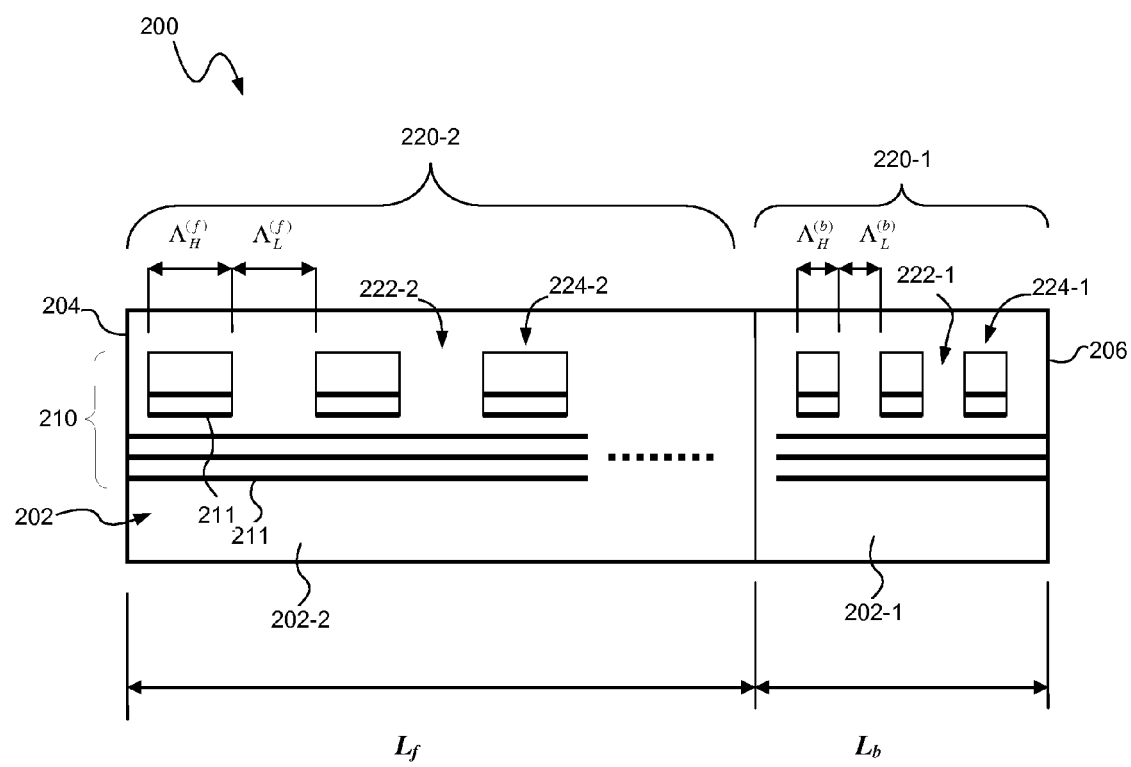
FIG. 2 is a diagrammatic side view of a gain-coupled DFB laser including first order and second order grating sections, consistent with an embodiment.

FIG. 2 shows a DFB laser device 200, consistent with an embodiment, configured to provide substantially pure gain coupling and facet power asymmetry. The DFB laser device 200 includes a laser cavity 202 with first and second laser cavity sections 202-1, 202-2 including first-order and second-order grating sections 220-1, 220-2, respectively. In the exemplary embodiment, the laser cavity sections 202-1, 202-2 are located in the back and front of the laser device 200, respectively, such that the back laser cavity section 202-1 includes the first-order grating section 220-1 and the front laser cavity section 202-2 includes the second-order grating section 220-2. The first-order grating section 220-1 generally has a grating period or pitch of one-half wavelength where as the second-order grating section 220-2 has a grating period or pitch of one wavelength. In other embodiments, the laser 200 may include additional laser cavity sections with additional grating sections. The grating sections 220-1, 220-2 may be formed with different grating periods, for example, by electron beam writing and changing the grating pitch along the cavity length.

In the exemplary embodiment, the first or back laser cavity section 202-1 has a length $L_b$ and the second or front laser cavity section 202-2 has a length $L_f$. The lengths $L_b$, $L_f$ of the laser cavity sections 202-1, 202-2 may be selected such that the second-order grating section 220-2 (e.g., in the second or front cavity section 202-2) is longer and provides the main feedback mechanism for lasing. The first-order grating section 220-1 (e.g., in the first or back cavity section 202-1) is shorter and acts as a reflector for the lasing wavelength. The laser cavity 202 may also have front and back facets 204, 206, which may be AR (antireflection) coated to eliminate facet reflections.

The grating sections 220-1, 220-2 may be formed in an active region 210 of the laser cavity 202, for example, as described above and shown in FIG. 1. The grating sections 220-1, 220-2 thus include alternating low corrugation regions 222-1, 222-2 and high corrugation regions 224-1, 224-2. In the first-order grating section 220-1 in the back cavity section 202-1, the low corrugation regions 222-1 have a length $\Lambda_L^{(b)}$ and the high corrugation regions 224-1 have a length $\Lambda_H^{(b)}$. The grating period of the first-order grating section 220-1 is thus $\Lambda^{(b)}=\Lambda_L^{(b)}+\Lambda_H^{(b)}$. In the second-order grating section 220-2, the low corrugation regions 222-2 have a length $\Lambda_L^{(f)}$ and the high corrugation regions 224-2 have a length $\Lambda_H^{(f)}$. The grating period of the second-order grating section 220-2 is thus $\Lambda^{(f)}=\Lambda_L^{(f)}+\Lambda_H^{(f)}$. The grating period $\Lambda^{(f)}$ of the second-order grating section 220-2 is twice the grating period $\Lambda^{(b)}$ of the first-order grating section 220-1.

The duty cycle $D^{(b)}$, $D^{(f)}$ of the of the grating sections 220-1, 220-2 may be represented respectively as $D^{(b)}=\Lambda_L^{(b)}/\Lambda^{(b)}$ and $D^{(f)}=\Lambda_L^{(f)}/\Lambda^{(f)}$. In the exemplary embodiment, the duty cycle $D^{(f)}$ of at least the second-order grating section 220-2 is about 50% to provide substantially pure gain coupling, as will be described in greater detail below. As used herein, "about 50%" allows a variation within acceptable tolerances.

The low corrugation regions 222-1, 222-2 and the high corrugation regions 224-1, 224-2 provide alternating regions with complex indices, $N_L$ and $N_H$, respectively, which are a function of the QWs in the corrugation region. The complex indices, $N_L$ and $N_H$, may be expressed as follows:

$$N_s = n_s + jm_s \quad (6)$$

where $n_s$ and $m_s$ are the real part and imaginary part of the complex index for the section s (s=H or L) and $m_s$ can be expressed as $$m_s = [\Gamma_s g_s - (1-\Gamma_s)\alpha_s]/(2k) \quad (7)$$

where $\Gamma_s$ is the optical confinement factor for the active QW, $g_s$ is the material gain in the QW, $\alpha_s$ is the absorption loss in other layer, and k is the vacuum wavenumber. In the exemplary embodiment, the refractive index $n_H$ of the high corrugation regions 224-1, 224-2 is larger than the refractive index $n_L$ of the low corrugation regions 222-1, 222-2 because the high corrugation regions have more quaternary materials which have a higher refractive index. In the exemplary embodiment, the optical confinement factor $\Gamma_H$ of the high corrugation regions 224-1, 224-2 is larger than the optical confinement factor $\Gamma_L$ of the low corrugation regions 222-1, 222-2 because the high corrugation region has a larger number of QWs and $\Gamma_s$ is roughly proportional to the number of QWs. The absorption loss $\alpha_s$ is also usually smaller than the material gain $g_s$ resulting in $m_H > m_L$.

In general, the difference in the real parts $n_H$ and $n_L$ may provide index coupling and the difference in the imaginary parts $m_H$ and $m_L$ may provide gain coupling. In the exemplary embodiment, the second-order grating section 220-2 has a duty cycle of substantially 50%, which causes the index coupling coefficient to become substantially zero. Thus, the index coupling provided by the quantum well etching in the second-order grating section 220-2 does not contribute to feedback in the grating direction and only gain coupling is provided by the modulation of quantum well numbers. The resulting substantially pure gain coupling gives a single mode oscillation at the Bragg wavelength $\lambda_{Bf}$ of the second-order grating section 220-2.

In the exemplary embodiment, the main mode is determined by the second cavity section 202-2 (e.g., the front cavity section), which is made longer than the first cavity section 202-1 (e.g., the back cavity section). The second cavity section 202-2 may be, for example, 70~80% of the total cavity length. Thus, the lasing wavelength of the DFB laser 200 is obtained at the Bragg wavelength $\lambda_{Bf}$ of the second order-grating section 220-2 in the second or front cavity section 202-2. The grating period or pitch $\Lambda^{(f)}$ of the second-order grating section 220-2 may be selected therefore to provide a Bragg wavelength $\lambda_{Bf}$ at the desired lasing wavelength (e.g., 1.31 μm). The substantially pure gain coupling may thus reduce wavelength variation due to the ratio of index coupling to gain coupling and improve the wavelength accuracy of the DFB laser 200. The first-order grating section 220-1 in the first or back cavity section 202-1 acts mainly as a reflector for the lasing wavelength, which produces an asymmetric power distribution in the laser cavity, resulting in an increased front facet power.

Figure 3:
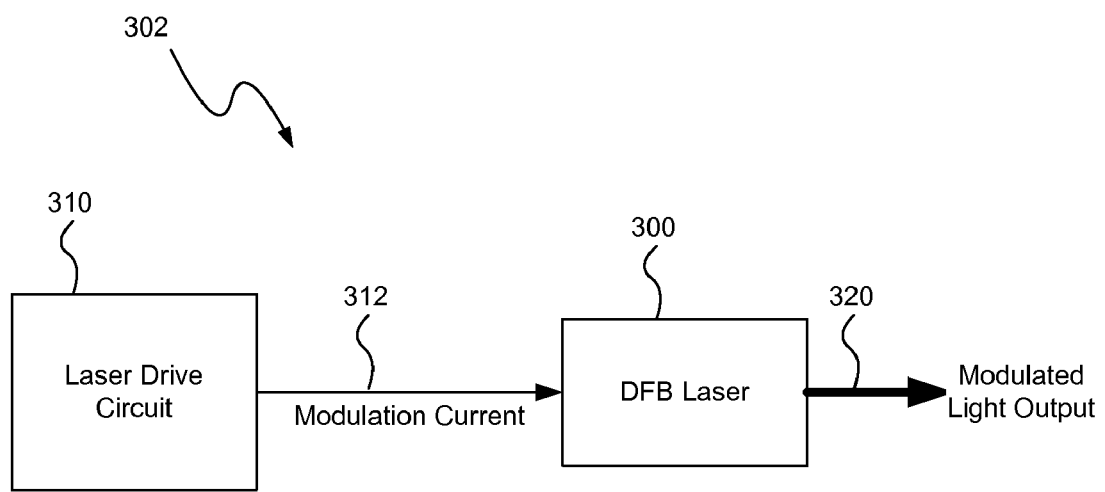
FIG. 3 is a schematic functional block diagram of a laser transmitter including a directly-modulated gain-coupled DFB laser, consistent with another embodiment.

Referring to FIG. 3, a gain coupled DFB laser 300, according to any of the embodiments described above, may be used in a laser transmitter 302 including a laser drive circuit 310. The gain coupled DFB laser 300 may be electrically coupled to the laser drive circuit 310 and optically coupled to an optical waveguide (not shown) such as an optical fiber. One example of the laser transmitter 302 is a laser transmitter designed for optical fiber communication applications, such as the type available from Applied Optoelectronics, Inc. for use in CATV applications. In such "broadband" applications, the laser transmitter 302 and particularly the gain coupled DFB laser 300 may be designed for high bit rate operation, for example, up to about 10 Gb/s, and the gain coupled DFB laser 300 may be configured for operation at wavelengths such as 1310 nm and 1550 nm. This example of the laser transmitter 302 may also include other components, such as an RF amplifier, a thermoelectric cooler (TEC) controller, a microcontroller, a predistortion circuit, and/or a clipping correction circuit, as well as other components known to those skilled in the art for use in a laser transmitter. Embodiments of the gain coupled DFB laser may also be used in other types of laser transmitters used in other communications applications or in other non-communications applications, such as chemical sensing.

The laser drive circuit 310 may include circuitry known to those skilled in the art for providing at least a modulation current 312 to the gain coupled DFB laser 300. The laser drive circuit 310 may also provide other currents to the gain coupled DFB laser 300 such as a laser threshold current and/or a bias current. The gain coupled DFB laser 300 receives the modulation current 312 and generates a modulated light output 320 in response to the modulation current 312. Thus, the modulation of the light occurs within the cavity of the gain coupled DFB laser 300 in this embodiment. When providing direct modulation in the laser transmitter 302, a more stable single-mode operation and improved single-mode yield and output power may be achieved by using the gain coupled DFB laser 300 including the first-order and second-order grating sections as described above.

Accordingly, embodiments of the gain-coupled DFB laser improve single-mode operation, yield and wavelength accuracy. Consistent with one embodiment, a gain-coupled distributed feedback (DFB) semiconductor laser device includes a laser cavity including at least first and second laser cavity sections and an active region located in the laser cavity. The active region includes a plurality of quantum-well layers and barrier layers between the quantum-well layers with the band gap energy of the barrier layers being greater than the band gap energy of the quantum-well layers. The laser also includes a grating formed by grooves extending at least partially through the active region and spaced along at least a portion of the laser cavity. The grating includes a first-order grating section in the first cavity section and a second-order grating section in the second cavity section. The second-order grating section is longer than the first-order grating section. At least the second-order grating section has a duty cycle of about 50% such that a lasing wavelength is obtained at a Bragg wavelength of the second-order grating section. The first-order grating section is configured to reflect the lasing wavelength.

Consistent with another embodiment, a laser transmitter includes a laser drive circuit configured to provide at least a modulation current and a gain-coupled distributed feedback semiconductor laser configured to receive the modulation current and configured to generate a modulated light output in response to the modulation current. The gain-coupled distributed feedback laser includes a laser cavity including at least first and second laser cavity sections and an active region located in the laser cavity. The active region includes a plurality of quantum-well layers and barrier layers between the quantum-well layers with the band gap energy of the barrier layers being greater than the band gap energy of the quantum-well layers. The laser also includes a grating formed by grooves extending at least partially through the active region and spaced along at least a portion of the laser cavity. The grating includes a first-order grating section in the first cavity section and a second-order grating section in the second cavity section. The second-order grating section is longer than the first-order grating section. At least the second-order grating section has a duty cycle of about 50% such that a lasing wavelength is obtained at a Bragg wavelength of the second-order grating section. The first-order grating section is configured to reflect the lasing wavelength.

While the principles of the invention have been described herein, it is to be understood by those skilled in the art that this description is made only by way of example and not as a limitation as to the scope of the invention. Other embodiments are contemplated within the scope of the present invention in addition to the exemplary embodiments shown and described herein. Modifications and substitutions by one of ordinary skill in the art are considered to be within the scope of the present invention, which is not to be limited except by the following claims.

What is claimed is:

1. A gain-coupled distributed feedback (DFB) semiconductor laser device, comprising:
    a laser cavity including at least first and second laser cavity sections;
    an active region located in the laser cavity, the active region comprising a plurality of quantum-well layers and barrier layers between the quantum-well layers, the band gap energy of the barrier layers being greater than the band gap energy of the quantum-well layers; and
    a grating formed by grooves extending at least partially through the active region and spaced along at least a portion of the laser cavity, wherein the grating comprises a first-order grating section in the first cavity section and a second-order grating section in the second cavity section, wherein the second-order grating section is longer than the first-order grating section, wherein at least the second-order grating section has a duty cycle of about 50% such that a lasing wavelength is obtained at a Bragg wavelength of the second-order grating section and such that the second-order grating section has an index coupling coefficient of substantially zero and provides substantially pure gain coupling, and wherein the first-order grating section is configured to reflect the lasing wavelength.

2. The laser device of claim 1 wherein the grating includes alternating high and low corrugation regions of different effective refractive indices, and wherein the corrugation regions of the first-order grating have a length that is half a length of the corrugation regions of the second-order grating.

3. The laser device of claim 1 wherein the laser cavity includes a front cavity section and a back cavity section, the first-order grating section being in the back cavity section and the second-order grating section being in the front cavity section.

4. The laser device of claim 1 wherein the grooves extend into at least one of the barrier layers, and wherein the grooves are filled with a fill layer, the at least one of the barrier layers and the fill layer being made of semiconductor materials having substantially the same band gap energy.

5. The laser device of claim 1 wherein the active region comprises:
    a plurality of quantum-well layers of band gap energy $E_{q1}$ adjoined with barrier layers of band gap energy $E_{b1}$ wherein $E_{b1} > E_{q1}$; and
    two quantum-well layers of band gap energy $E_{q2}$ adjoined with a barrier layer of band gap energy $E_{b2}$ in between the two quantum-well layers and adjoined with two outside barrier layers of band gap energy $E_{b1}$, wherein $E_{b2} > E_{b1} > E_{q1} \geq E_{q2}$.

6. The laser device of claim 5 wherein the grooves extend into the barrier layer of band gap energy $E_{b2}$, and wherein the grooves are filled with a fill layer, the barrier layer of band gap energy $E_{b2}$ and the fill layer being made of semiconductor materials having substantially the same band gap energy.

7. The laser device of claim 6 wherein the fill layer and the barrier layer of band gap energy $E_{b2}$ are made of InP material.

8. The laser device of claim 5 wherein the quantum-well layers of band gap energy $E_{q1}$ are InGaAsP.

9. The laser device of claim 5 wherein the quantum-well layers of band gap energy $E_{q2}$ are InGaAsP.

10. The laser device of claim 5 wherein the barrier layers of band gap energy $E_{b1}$ are InGaAsP.

11. A laser transmitter comprising:

a laser drive circuit configured to provide at least a modulation current; and a gain-coupled distributed feedback semiconductor laser configured to receive the modulation current and configured to generate a modulated light output in response to the modulation current, the gain-coupled feedback semiconductor laser comprising:

a laser cavity including at least first and second laser cavity sections;

an active region located in the laser cavity, the active region comprising a plurality of quantum-well layers and barrier layers between the quantum-well layers, the band gap energy of the barrier layers being greater than the band gap energy of the quantum-well layers; and a grating formed by grooves extending at least partially through the active region and spaced along at least a portion of the laser cavity, wherein the grating comprises a first-order grating section in the first cavity section and a second-order grating section in the second cavity section, wherein the second-order grating section is longer than the first-order grating section, wherein at least the second-order grating section has a duty cycle of about 50% such that a lasing wavelength is obtained at a Bragg wavelength of the second-order grating section and such that the second-order grating section has an index coupling coefficient of substantially zero and provides substantially pure gain coupling, and wherein the first-order grating section is configured to reflect the lasing wavelength.

12. The laser transmitter of claim 11 wherein the grating includes alternating high and low corrugation regions of different effective refractive indices, and wherein the corrugation regions of the first-order grating have a length that is half a length of the corrugation regions of the second-order grating.

13. The laser transmitter of claim 11 wherein the laser cavity includes a front cavity section and a back cavity section, the first-order grating section being in the back cavity section and the second-order grating section being in the front cavity section.

14. The laser transmitter of claim 10 wherein the grooves extend into at least one of the barrier layers, and wherein the grooves are filled with a fill layer, the at least one of the barrier layers and the fill layer being made of semiconductor materials having substantially the same band gap energy.

* * * * *